United States Patent
Kwak et al.

(10) Patent No.: US 7,092,299 B2
(45) Date of Patent: Aug. 15, 2006

(54) MEMORY DEVICES, SYSTEMS AND METHODS USING SELECTIVE ON-DIE TERMINATION

(75) Inventors: Jin-Seok Kwak, Gyeonggi-do (KR); Seong-Jin Jang, Gyeonggi-do (KR); Young-Hyun Jun, Seoul (KR)

(73) Assignee: Samsung Electronics Co., Ltd. (KR)

(*) Notice: Subject to any disclaimer, the term of this patent is extended or adjusted under 35 U.S.C. 154(b) by 209 days.

(21) Appl. No.: 10/792,623

(22) Filed: Mar. 3, 2004

(65) Prior Publication Data

US 2004/0228196 A1    Nov. 18, 2004

(30) Foreign Application Priority Data

May 13, 2003    (KR)    .......................... 10-2003-30350

(51) Int. Cl.
    *G11C 7/00* (2006.01)
(52) U.S. Cl. ........................................ 365/189; 365/63
(58) Field of Classification Search ................ 365/198, 365/63; 326/21, 20; 710/100
    See application file for complete search history.

(56) References Cited

U.S. PATENT DOCUMENTS 6,538,951 B1 * 3/2003 Janzen et al. .......... 365/230.03
6,754,129 B1 * 6/2004 Khatri et al. ................ 365/226
6,917,546 B1 * 7/2005 Matsui ........................ 365/198

* cited by examiner

*Primary Examiner*—Vu A. Le
(74) *Attorney, Agent, or Firm*—Myers Bigel Sibley & Sajovec PA

(57) ABSTRACT

A memory system includes first and second memory devices having commonly connected data terminals and commonly connected memory control signal terminals, e.g., devices in respective first and second independently selectable memory banks that share common data lines and common memory control signal lines, such as column address strobe, row address strobe, write enable, and address signal lines. The first and second memory devices includes respective selective on-die termination (ODT) circuits configured to selectively provide first and second termination impedances at their respective data terminals responsive to a memory control signal at the commonly connected memory control signal terminals. The selective ODT circuits may produce the first termination impedance responsive to a memory write operation, and may produce the second termination impedance responsive to a memory read operation and/or expiration of a predetermined time interval following termination of the memory write operation. Preferably, the first termination impedance is less than the second termination impedance, and the selective ODT circuits provide the first termination impedance responsive to the memory write operation irrespective of which of the first and second memory devices is being written to.

26 Claims, 8 Drawing Sheets

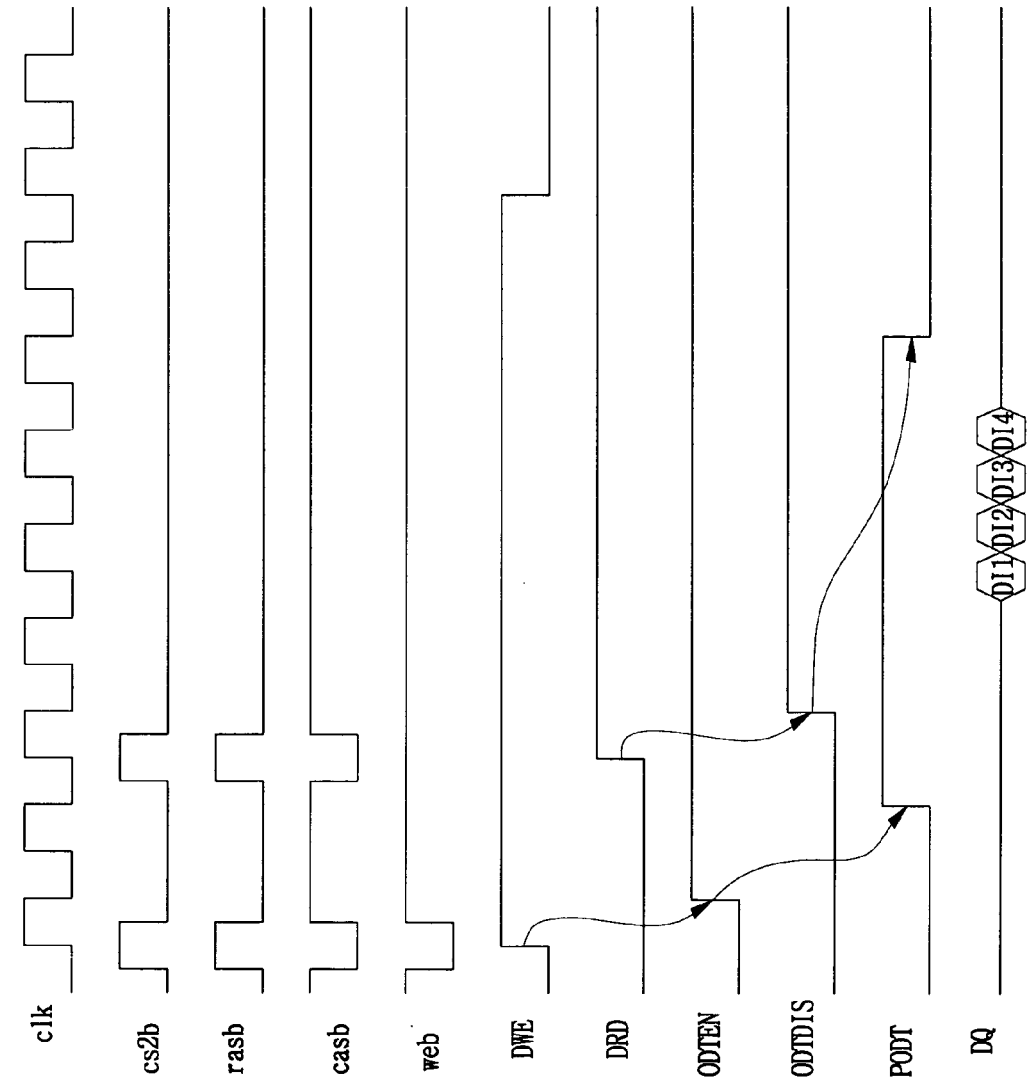

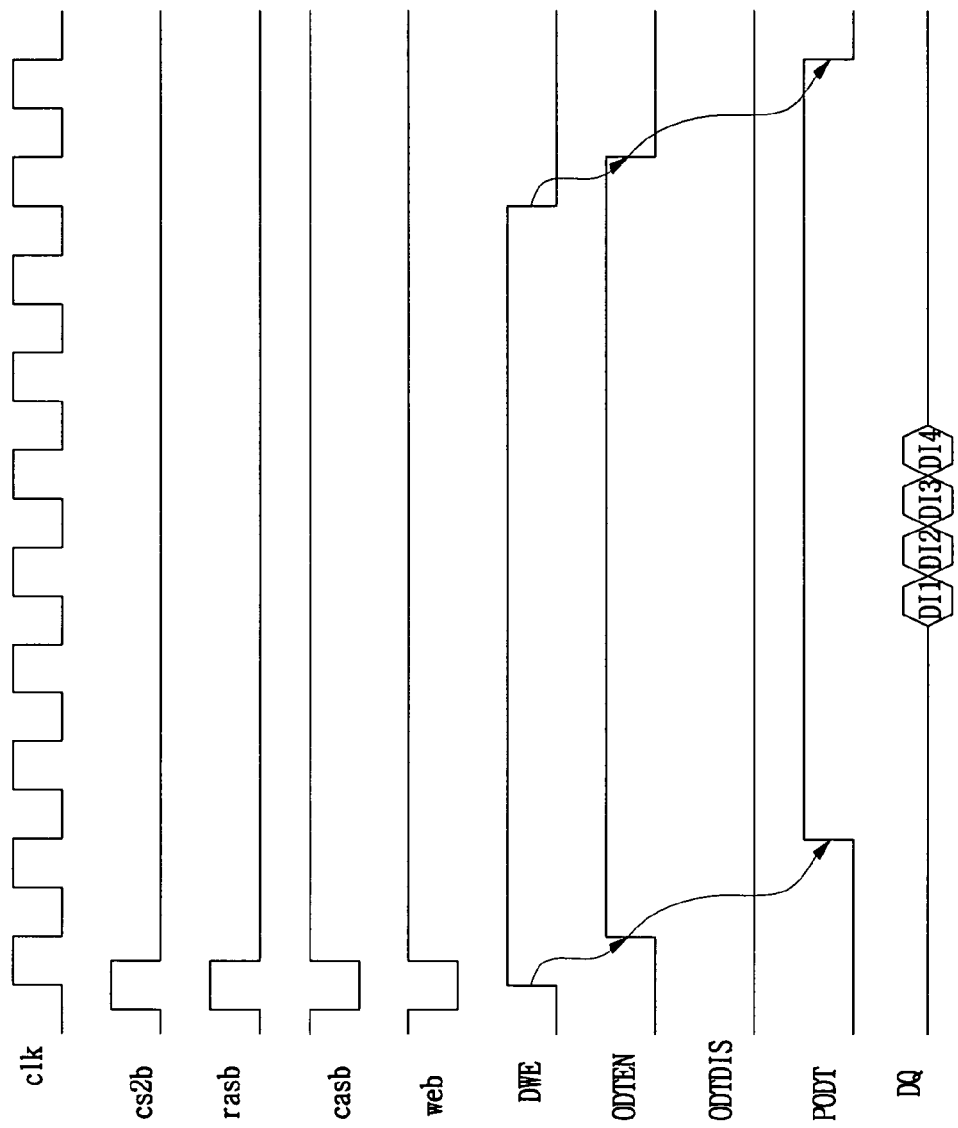

MEMORY DEVICES, SYSTEMS AND METHODS USING SELECTIVE ON-DIE TERMINATION

This U.S. nonprovisional patent application claims priority under 35 U.S.C. § 119 of Korean Patent Application 2003-30350 filed on May 13, 2003, the entire contents of which are hereby incorporated by reference.

BACKGROUND OF THE INVENTION

The present invention relates to memory systems, and more particularly, to signal termination in memory systems.

One conventional signal termination technique terminates a signal by connecting a termination resistor and a termination voltage to signal lines arranged on a system board. However, as the number of signal lines arranged on the system board increases, it may become difficult to arrange a termination circuit on the system board.

To solve the above problem, on-die-termination techniques have been developed. One conventional on-die-termination technique terminates a signal by arranging a termination circuit on an integrated circuit die, rather than on the system board. This can enhance arrangement of signal lines on the system board.

In one such conventional on-die-termination method in a conventional dual bank system, once a power supply voltage is applied to the system, an on-die-termination circuit is enabled to connect a termination voltage to data input/output (or input) pads, thereby terminating the signal. Although this method may be simple, it has the potential problem that the on-die-termination circuit is operated even when unneeded, that is, when data are not input to the system. Accordingly, an undesirable amount of energy may be dissipated through the on-die-termination circuit.

Generally, the number of the on-die-termination circuits in such a conventional system is the same as the number of data input/output (or input) pads. Accordingly, the more data input/output (or input) pads of the memory, the more on-die-termination circuits are needed, so the energy wasted by the on-die-termination circuits can become significantly large.

SUMMARY OF THE INVENTION

In some embodiments of the present invention, a memory system includes first and second memory devices in respective independently selectable banks and having commonly connected data terminals and commonly connected memory control signal terminals, e.g., devices in respective first and second independently selectable memory banks that share common data lines and common memory control signal lines, such as column address strobe, row address strobe, write enable, and address signal lines. The first and second memory devices include respective selective on-die termination (ODT) circuits configured to selectively provide first and second termination impedances at their respective data terminals responsive to a memory control signal at the commonly connected memory control signal terminals. The selective ODT circuits may provide the first termination impedance responsive to a memory write operation, and may provide the second termination impedance responsive to a memory read operation and/or expiration of a predetermined time interval following termination of the memory write operation. Preferably, the first termination impedance is less than the second termination impedance, and the selective ODT circuits provide the first termination impedance responsive to the memory write operation irrespective of which of the first and second memory devices is being written to.

In further embodiments of the present invention, each of the ODT circuits includes an ODT control circuit configured to receive a memory control signal and operative to generate an ODT control signal responsive to the memory control signal. The ODT circuits also include a termination circuit configured to receive the ODT control signal and to selectively provide the first and second termination impedances at the data terminal of the memory device responsive to respective first and second states of the ODT control signal.

The ODT control circuit may comprise a command decoder operative to produce a write enable signal, a dummy write enable signal, a read signal and dummy read signal responsive to the memory control signal, a first OR gate configured to logically OR the write enable signal and the dummy write enable signal to produce an ODT enable signal, a second OR gate configured to logically OR the read signal and the dummy read signal to produce an ODT disable signal, and an ODT control signal generating circuit configured to receive the ODT enable signal and the ODT disable signal and to generate the ODT control signal therefrom. The termination circuit may include first and second resistors having first terminals connected to the data terminal and first and second transistors that couple and decouple second terminals of respective ones of the first and second transistors to and from respective ones of a power supply node and a signal ground node responsive to the ODT control signal.

In further embodiments of the invention, memory devices with selective ODT capability may be provided. Such a memory device may include a data terminal, a memory control signal terminal, and a selective ODT circuit configured to selectively provide first and second termination impedances at the data input terminal responsive to a memory control signal at the memory control signal terminal. In some method embodiments of the present invention, in a multi-bank memory system that includes first and second memory devices having commonly connected data terminals and commonly connected memory control signal terminals, first and second on-die termination (ODT) impedances are selectively provided at the data terminals responsive to a memory control signal at the commonly connected memory control signal terminals.

BRIEF DESCRIPTION OF THE DRAWINGS

FIGS. 6A and 6B are timing diagrams illustrating operations of memory devices in banks of a dual bank memory system in accordance with additional embodiments of the present invention.

DETAILED DESCRIPTION OF THE EXEMPLARY EMBODIMENTS

Figure 1:
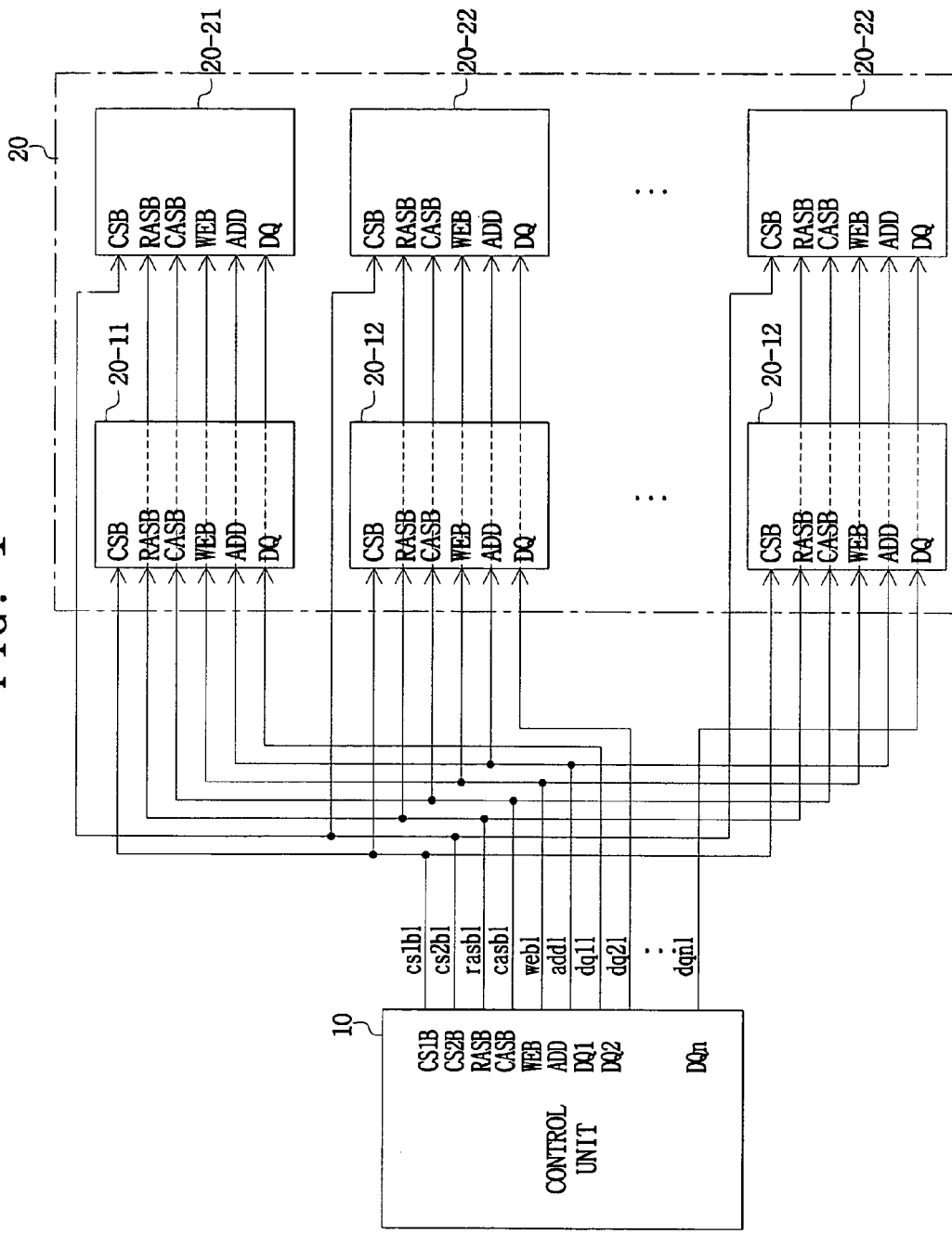
FIG. 1 is a schematic diagram illustrating a dual bank memory system in accordance with some embodiments of the present invention.

The present invention now will be described more fully with reference to the accompanying drawings, in which exemplary embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

FIG. 1 is a schematic diagram illustrating a general dual bank memory system 100 according to some embodiments of the present invention. The system 100 includes a control circuit 10 and a memory module 20. The memory module 20 comprises memory devices 20-11 to 20-1n, 20-21 to 20-2n, of which memory devices 20-11 to 20-1n are arranged in a first column on the memory module 20, and memory devices 20-21 to 20-2n are arranged in a second column on the memory module 20.

Signal transmission between the control circuit 10 and memory devices 20-11 to 20-1n, 20-21 to 20-2n will now be described. A first chip select signal line cs1b1 connects a first chip select signal terminal CS1B of the control unit 10 to chip select signal terminals CSB of the memory devices 20-11 to 20-1n. A second chip select signal line cs2b1 connects a second chip select signal terminal CS2B of the control unit 10 to inverted chip select signal terminals CSB of the memory devices 20-21 to 20-2n. A row address strobe signal line rasb1, a column address strobe signal line casb1, a write enable signal line web1, and an address signal line respectively connect a row address strobe signal terminal RASB, a column address strobe signal terminal CASB, a write enable signal terminal WEB, and an address signal terminal ADD of the control unit 10 to respective ones of row address strobe signal terminals RASB, column address strobe signal terminals CASB, write enable signal terminals WEB, and address signal terminals ADD of the memory devices 20-11 to 20-1n, 20-21 to 20-2n. A data input/output line dq11 connects a data input/output terminal DQ1 of the control unit 10 to data input/output terminals DQ of the memory devices 20-11, 20-21, and a data input/output line dq21 connects a data input/output terminal DQ2 of the control unit 10 to data input/output terminals DQ of the memory devices 20-12, 20-22. Similarly, a data input/output line dqn1 connects a data input/output terminal DQn of the control unit 10 to data input/output terminals DQ of the memory devices 20-1n, 20-2n.

In the dual bank system of FIG. 1, memory devices 20-11 to 20-1n in the first column of the memory module 20 are selected when the control unit 10 generates a chip select signal cs1b having a "low" level, and data dq1 to dqn are simultaneously applied to memory devices (20-11, 20-21), (20-12, 20-22), (20-1n, 20-2n) in the first and second columns of the memory module 20 when the control unit 10 generates data dq1 to dqn with a write enable signal web having a "low" level. In other words, in the dual bank system, when the memory devices 20-11 to 20-1n in the first column are to receive data in a write operation, the same data is also applied to the memory devices 20-21 to 20-2n in the second column. Similarly, when memory devices 20-21 to 20-2n in the second column of the memory module 20 are to receive data in a write operation, the data is also applied to the memory devices 20-11 to 20-1n in the first column of the memory module 20.

Figure 2:
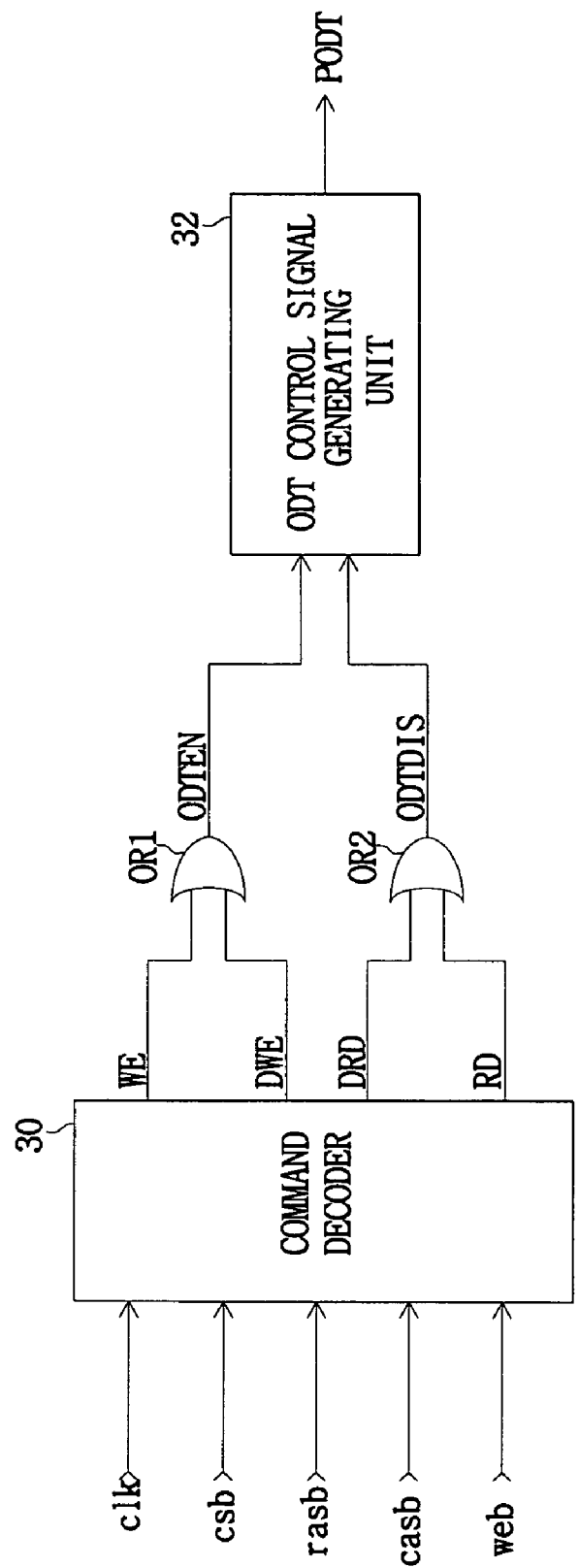
FIG. 2 is a block diagram illustrating a memory configuration for use in a dual bank memory system in accordance with further embodiments of the present invention.

FIG. 2 is a block diagram illustrating an ODT control circuit 200 of an ODT circuit in a memory device, such as the devices 20-11 to 20-1n and 20-21 to 20-2n, that may be used in the dual bank system shown in FIG. 1 in accordance with further embodiments of the present invention. The ODT control circuit 200 includes a command decoder 30, OR gates OR1, OR2, and an on-die-termination (hereinafter, referred to as ODT) control signal generating unit 32. The command decoder 30 decodes command signals, including a clock signal clk, a chip select signal csb, a row address strobe signal rasb, a column address strobe signal casb, and a write enable signal web applied from an external source, to generate a write enable signal WE, a dummy write enable signal DWE, a dummy read signal DRD, and a read signal RD. The OR gate OR1 performs a logical OR between the write enable signal WE and the dummy write enable signal DWE to generate the ODT enable signal ODTEN. The OR gate OR 2 performs a logical OR between the dummy read signal DRD and the read signal RD to generate the ODT disable signal ODTDIS. The ODT control signal generating unit 32 activates an ODT control signal PODT in response to the ODT enable signal ODTEN, and deactivates the ODT control signal PODT in response to the ODT disable signal ODTDIS.

The command decoder 30 generates the dummy write signal DWE and the dummy read signal DRD in addition to the write signal WE and the read signal RD. Table 1 shows exemplary operations of the memory configuration of FIG. 2 (in Table 1, L represents a "low" level, and H represents a "high" level, respectively):

TABLE 1

| Internal commands | External commands | | | | | | |
|---|---|---|---|---|---|---|---|
| | csb | rasb | casb | Web | ODTEN | ODTDIS | PODT |
| WE | L | H | L | L | H | L | H |
| RD | L | H | L | H | L | H | L |
| DWE | H | H | L | L | H | L | H |
| DRD | H | H | L | H | L | H | L |

The command decoder 30 activates the write signal WE when the chip select signal csb is a "low" level and the other command signals, including the row address strobe signal rasb, the column address strobe signal casb, and the write enable signal web are at a "high" level, a "low" level, and a "low" level, respectively. The OR gate OR1 activates the ODT enable signal ODTEN a "high" level when the high-level write signal WE or the dummy write signal DWE have a "high" level. The ODT control signal generating unit 32 activates the ODT control signal PODT to a "high" level when the ODT enable signal ODTEN has a "high" level.

The command decoder 30 activates the read signal RD when the chip select signal csb is at a "low" level and the row address strobe signal rasb, the column address strobe signal casb, and the write enable signal web, are at a "high"

level, a "low" level, and a "high" level, respectively. The OR gate OR 2 activates the ODT disable signal ODTDIS to a "high" level when the dummy read signal DRD is at a "high" level. The ODT control signal generating unit 32 deactivates the ODT control signal PODT to a "low" level when the ODT disable signal ODTDIS is at a "high" level. In other words, the ODT control signal PODT is activated in response to a write operation, irrespective of the state of the chip select signal csb, and the ODT control signal PODT is deactivated to a "low" level responsive to a read operation. Accordingly, energy dissipation in the on-die-termination circuit can be reduced.

Referring back to FIG. 1, when writing data, ODT circuits of memory devices 20-11 to 20-1n, 20-21 to 20-2n of the memory module 20 are enabled to terminate signals applied to memories 20-11 to 20-1n, 20-21 to 20-2n. That is, because the dual bank system is configured such that data is applied to both columns of memory devices when performing a write operation, the ODT circuits in the devices that are actually not being written to are enabled to terminate the data signals and reduce signal reflections from the non-selected memory devices.

Figure 3:
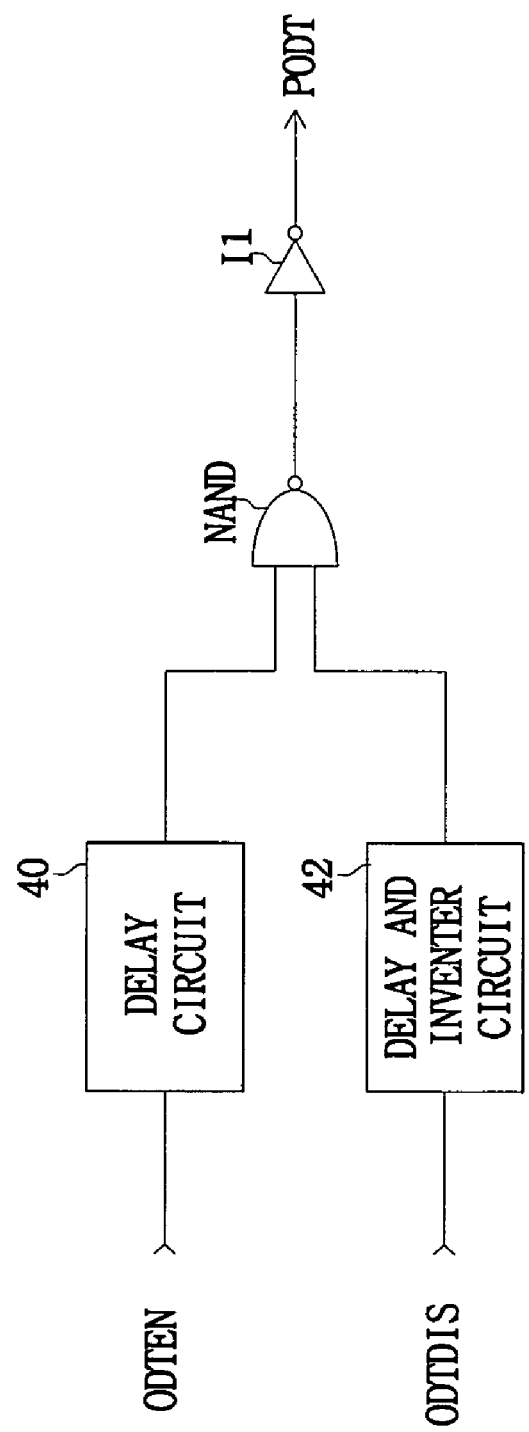
FIG. 3 is a circuit diagram of an ODT control signal generating circuit according to further embodiments of the present invention.

FIG. 3 is a circuit diagram illustrating an ODT control signal generating circuit 300 which may be used in the circuit 200 shown in FIG. 2. The circuit 300 includes a delay circuit 40, a delay and inverter circuit 42, a NAND gate NAND, and an inverter I1. The delay circuit 40 delays the ODT enable signal ODTEN by a first predetermined time. The delay and inverter circuit 42 delays the ODT disable signal ODTDIS by a second predetermined time. The NAND gate NAND and the inverter I1 perform a logical AND of the signals produced by the delay circuit 40 and the delay and inverter circuit 42 to generate the ODT control signal PODT. The ODT control signal PODT is activated in response to the activation of the ODT enable signal ODTEN, and is deactivated in response to the deactivation of the ODT enable signal ODTEN. The ODT control signal PODT is deactivated in response to the activation of the ODT disable signal ODTDIS, irrespective of the state of the ODT enable signal ODTEN. In other words, the ODT control signal PODT is activated during a period in which data is input to the memory device. This can be done by appropriately adjusting the first predetermined time of the delay circuit 40 and the second predetermined time of the delay and inverter circuit 42. Although the ODT control signal generating circuit shown in FIG. 3 includes the delay circuit 40 and the delay and inverter circuit 42, in some cases, a configuration without the delay circuit 40 and the delay and inverter circuit 42 is also possible.

Figure 4:
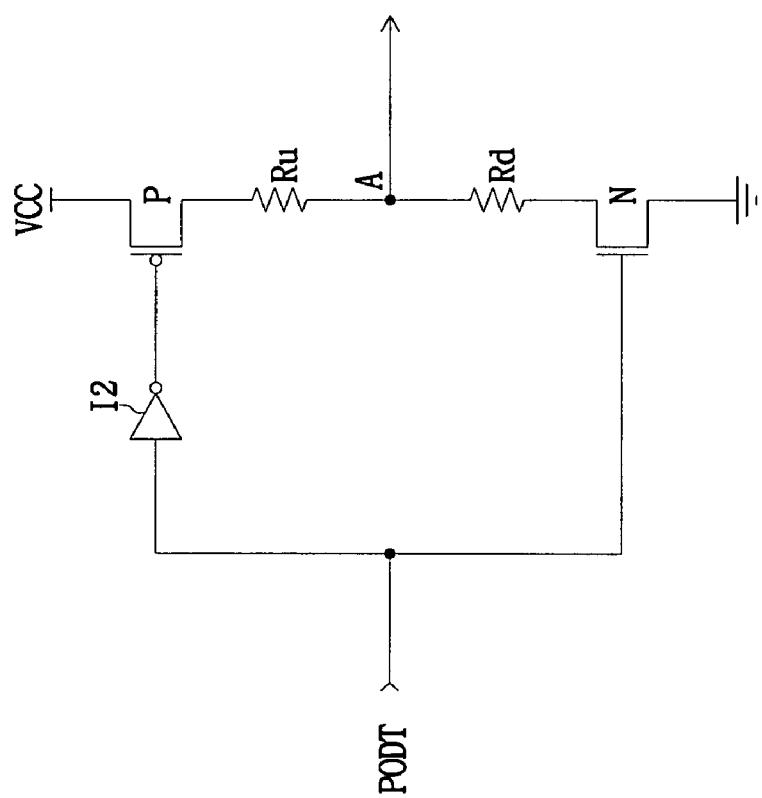
FIG. 4 is a circuit diagram for a termination circuit in accordance with additional embodiments of the present invention.

FIG. 4 is a circuit diagram of a termination circuit 400 according to further embodiments of the present invention. The termination circuit 400 includes an inverter 12, a PMOS transistor P, an NMOS transistor N, and resistors Ru, Rd. In FIG. 4, a termination node A is connected to a data input/output (or input) pad (not shown). When the ODT control signal PODT transitions to a "high" level, the inverter 12 produces a "low" level signal. Consequently, the NMOS transistor N and the PMOS transistor P are turned on. Therefore, the resistors Ru, Rd are coupled to power supply voltage VCC and a ground voltage to provide a termination for the node A.

Figure 5A:
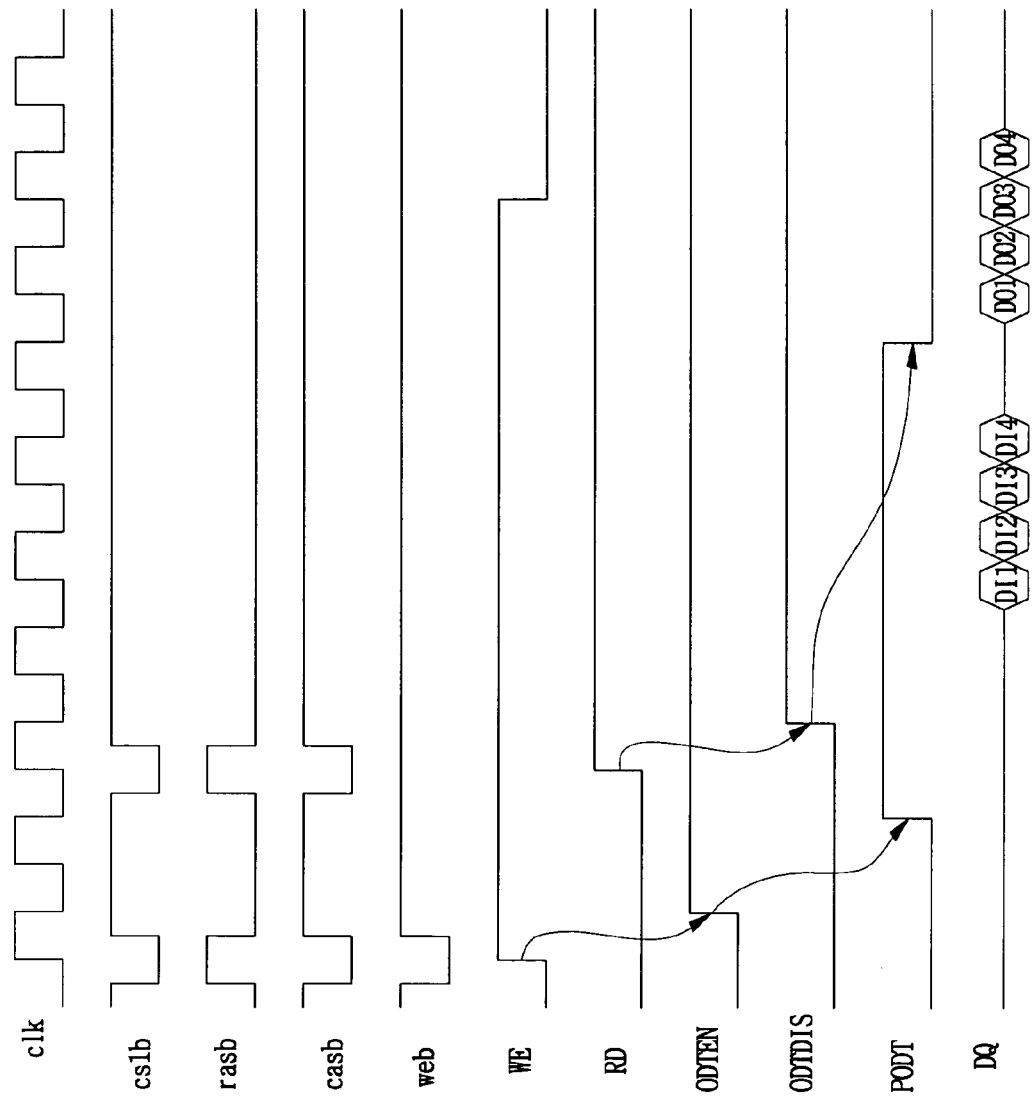
FIGS. 5A and 5A are timing diagrams illustrating operations of memory devices in banks of a dual bank memory system in accordance with further embodiments of the present invention.

FIGS. 5A and 5B are timing diagrams illustrating exemplary operations of a dual bank memory system according to further embodiments of the present invention, where a write command and a read command are sequentially applied to memory devices that are operated in Double Data Rate (DDR) mode with a write latency of 4, a CAS latency of 5, and a burst length of 4. As shown in the above Table 1, when the first chip select signal cs1b, the row address strobe signal rasb, the column address strobe signal casb, and the write enable signal web, in response to a rising edge of a clock signal clk, transition to a "low" level, a "high" level, a "low" level, and a "low" level, respectively, the memory devices 20-11 to 20-1n in the first column generate the write enable signal WE as illustrated in FIG. 5A, and the memory devices 20-21 to 20-2n in the second column generate the dummy write signal DWE as illustrated in FIG. 5B.

The memory devices 20-11 to 20-1n transition the ODT enable signal ODTEN to a "high" level in response to the write signal WE, as illustrated in FIG. 5A, while memory devices 20-21 to 20-2n transition the ODT signal ODTEN to a "high" level in response to the dummy write signal DWE, as illustrated in FIG. 5B. Consequently, each of memory devices 20-11 to 20-1n, 20-21 to 20-2n transitions the ODT control signal PODT to a "high" level in response to the ODT enable signal ODTEN, as illustrated in FIGS. 5A and 5B. Accordingly, the ODT circuits of the memory devices 20-11 to 20-1n, 20-21 to 20-2n are activated to provide signal terminations for the associated data lines. As noted above, although memories 20-21 to 20-2n in the second column do not perform an actual write operation, the ODT circuits in these devices provide appropriate signal termination impedances as data applied to the memory devices 20-11 to 20-1n in the first column is also applied to the memory devices 20-21 to 20-2n in the second column.

Two clock cycles after the write command is applied, when the first chip select signal cs1b, the row address strobe signal rasb, the column address strobe signal casb, and the write enable signal web have a "low" level, a "high" level, a "low" level, and a "high" level, respectively, the memory devices 20-11 to 20-1n in the first column activate read signals RD as illustrated in FIG. 5A and the memory devices 20-21 to 20-2n in the second column activate dummy read signal DRD as illustrated in FIG. 5B. Then, the memory devices 20-11 to 20-1n in the first column transition the ODT disable signal ODTDIS to a "low" level in response to the read signal RD as illustrated in FIG. 5A, while memory devices 20-21 to 20-2n in the second column transition the ODT disable signal ODTDIS to a "low" level in response to the dummy read signal DRD as illustrated in FIG. 5B. Therefore, each of memory devices 20-11 to 20-1n, 20-21 to 20-2n transitions its ODT control signal PODT to a "low" level in response to the ODT disable signal ODTDIS as illustrated in FIGS. 5A and 5B. Accordingly, the ODT circuits of the memory devices 20-11 to 20-1n, 20-21 to 20-2n in both columns are deactivated, i.e., provide higher termination impedances.

Figure 6A:
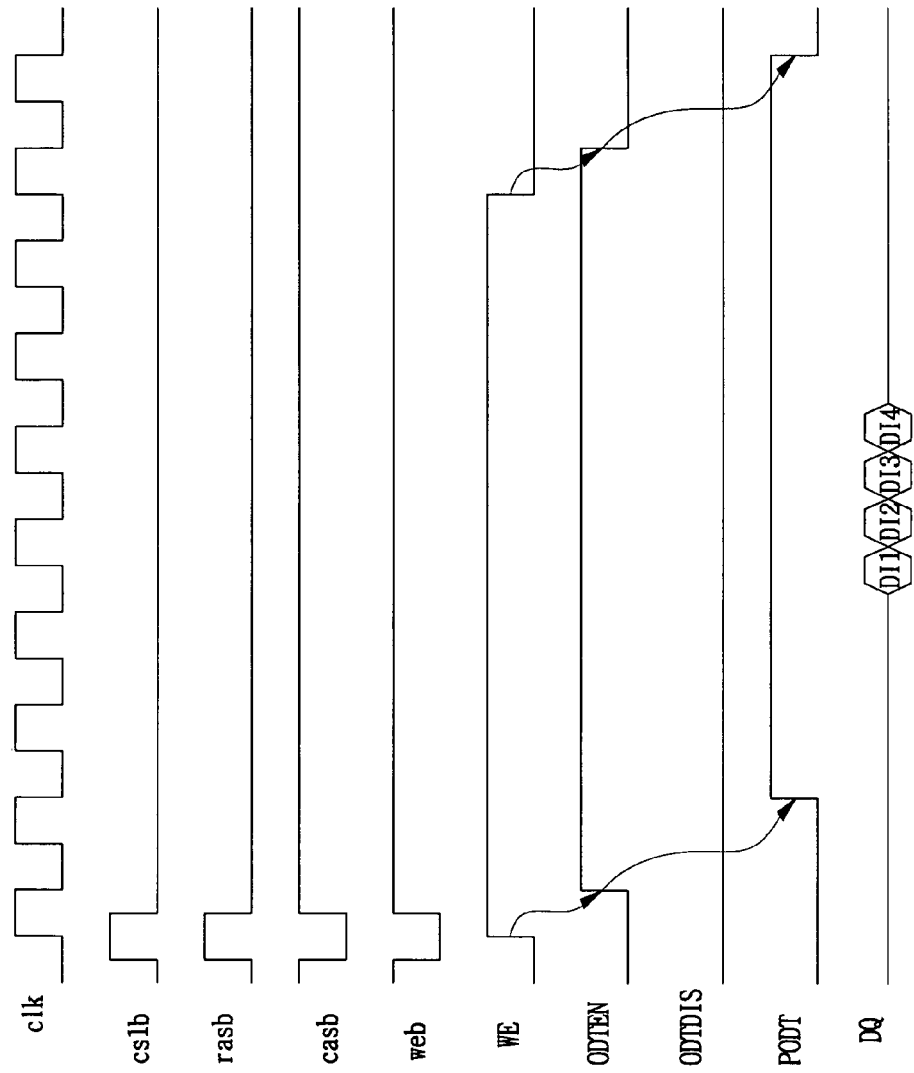

FIGS. 6A and 6B are timing diagrams for illustrating exemplary operations of a dual bank memory system according to further embodiments of the present invention, where a write command is applied to memory devices operating in a DDR mode with a write latency of 4, a CAS latency of 5, and a burst length of 4. As shown in the above Table 1, when the first chip select signal cs1b, the row address strobe signal rasb, the column address strobe signal casb, and the write enable signal web, in response to the rising edge of the clock signal clk, take on a "low" level, a "high" level, a "low" level, and a "low" level, respectively, the memory devices 20-11 to 20-1n in the first column activate the write enable signal WE as illustrated in FIG. 6A. Then, the ODT control signal PODT transitions to a "high" level in response to the write enable signal WE. The operation where the write enable signal WE is generated will be easily understood with reference to the above description of FIGS. 5A and 5B.

When their write enable signals WE transition to a "low" level, the memory devices 20-11 to 20-1n, 20-21 to 20-2n transition their ODT enable signals ODTEN to a "low" level in response to the write enable signals WE. The ODT control signals PODT then transition to a "low" level in response to the ODT enable signals ODTEN. Accordingly, the memory devices 20-11 to 20-1n, 20-21 to 20-2n deactivate their ODT circuits. In other words, the ODT control signals PODT of the memory devices 20-11 to 20-1n, 20-21 to 20-2n in the first and second columns are activated when their write enable signals WE are activated, and deactivate their ODT control signals PODT when their write enable signals WE are deactivated. Therefore, in a dual bank memory system according to some embodiments of the present invention, ODT circuits operate to fit the duration in which data is input to memories 20-11 to 20-1n, 20-21 to 20-2n, which can reduce power dissipation in the ODT circuits.

In the above-described embodiments, a multi-bank memory system, memory devices used for the same, and the ODT control operations thereof are described for DDR operation. It will be understood, however, that types of memory operation other than DDR may be used with the present invention. In addition, although the above-described embodiments use memory devices mounted in columns in a memory module, other memory device configurations may be used with the present invention, such as arrangements in which memory devices are mounted on a system board.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A memory system, comprising:
   first and second memory devices in respective independently selectable banks and having commonly connected data terminals and commonly connected memory read/write control signal terminals, each of the first and second memory devices including respective selective on-die termination (ODT) circuits configured to selectively provide first and second termination impedances at their respective data terminals responsive to respective different states of a memory read/write control signal at the commonly connected memory read/write control signal terminals.

2. A memory system according to claim 1, wherein the selective ODT circuits of the first and second memory devices provide the first termination impedance responsive to a memory write operation and wherein the selective ODT circuits of the first and second memory devices provide the second termination impedance responsive to a memory read operation and/or expiration of a predetermined time interval following termination of the memory write operation.

3. A memory system according to claim 2, wherein the first termination impedance is less than the second termination impedance.

4. A memory system according to claim 2, wherein the selective ODT circuits of the first and second memory devices provide the first termination impedance responsive to the memory write operation irrespective of which of the first and second memory devices is being written to.

5. A memory system according to claim 1, wherein each of the ODT circuits comprises:
   an ODT control circuit configured to receive the memory read/write control signal and operative to generate an ODT control signal responsive to the memory read/write control signal; and
   a termination circuit configured to receive the ODT control signal and to selectively provide the first and second termination impedances at the data terminal of the memory device responsive to respective first and second states of the ODT control signal.

6. A memory system according to claim 5, wherein the ODT control circuit comprises:
   a command decoder operative to produce a write enable signal, a dummy write enable signal, a read signal and dummy read signal responsive to the memory read/write control signal;
   a first OR gate configured to logically OR the write enable signal and the dummy write enable signal to produce an ODT enable signal;
   a second OR gate configured to logically OR the read signal and the dummy read signal to produce an ODT disable signal; and
   an ODT control signal generating circuit configured to receive the ODT enable signal and the ODT disable signal and to generate the ODT control signal therefrom.

7. A memory system according to claim 5, wherein the termination circuit comprises:
   first and second resistors having first terminals connected to the data terminal; and
   first and second transistors that couple and decouple second terminals of respective ones of the first and second transistors to and from respective ones of a power supply node and a signal ground node responsive to the ODT control signal.

8. A memory system according to claim 5, wherein the ODT control circuit is configured to generate the ODT control signal responsive to a memory clock signal, a chip select signal, a row address strobe signal, a column address strobe signal, and a write enable signal.

9. A memory device, comprising:
   a data terminal;
   a memory read/write control signal terminal; and
   a selective on-die-termination circuit configured to selectively provide first and second termination impedances at the data input terminal responsive to respective first and second states of a memory read/write control signal at the memory read/write control signal terminal.

10. A memory device according to claim 9, wherein the selective ODT circuit provides the first termination impedance responsive to a memory write operation and wherein the selective ODT circuit provides the second termination impedance responsive to a memory read operation and/or expiration of a predetermined time interval following termination of the memory write operation.

11. A memory device according to claim 10, wherein the first termination impedance is less than the second termination impedance.

12. A memory device according to claim 10, wherein the selective ODT circuit provides the first termination impedance responsive to the write operation irrespective of whether the device is being written to.

13. A memory device according to claim 9, wherein each of the ODT circuits comprises:
an ODT control circuit configured to receive the memory read/write control signal and operative to generate an ODT control signal responsive to the memory read/write control signal; and
a termination circuit configured to receive the ODT control signal and to selectively provide the first and second termination impedances at the data terminal of the memory device responsive to respective first and second states of the ODT control signal.

14. A memory device according to claim 13, wherein the ODT control circuit comprises:
a command decoder operative to produce a write enable signal, a dummy write enable signal, a read signal and dummy read signal responsive to the memory read/write control signal;
a first OR gate configured to logically OR the write enable signal and the dummy write enable signal to produce an ODT enable signal;
a second OR gate configured to logically OR the read signal and the dummy read signal to produce an ODT disable signal; and
an ODT control signal generating circuit configured to receive the ODT enable signal and the ODT disable signal and to generate the ODT control signal therefrom.

15. A memory device according to claim 13, wherein the termination circuit comprises:
first and second resistors having first terminals connected to the data terminal; and
first and second transistors that couple and decouple second terminals of respective ones of the first and second transistors to and from respective ones of a power supply node and a signal ground node responsive to the ODT control signal.

16. A memory system according to claim 13, wherein the ODT control circuit is configured to generate the ODT control signal responsive to a memory clock signal, a chip select signal, a row address strobe signal, a column address strobe signal, and a write enable signal.

17. A memory system according to claim 1, wherein the first and second memory devices have commonly connected address strobe signal terminals and wherein the selective ODT circuits are configured to provide the first and second termination impedances responsive to an address strobe signal at the commonly connected address strobe signal terminals.

18. A memory system according to claim 9, wherein the memory device comprises an address strobe signal terminal, and wherein the selective ODT circuit is configured to provide the first and second termination impedances responsive to an address strobe signal at the address strobe signal terminal.

19. A memory system comprising:
first memories selected in response to a first selection signal;
second memories selected in response to a second selection signal; and
a control unit that generates the first and the second selection signal, generates a command to both of the first and second memories, and inputs/outputs data from/to the first memories or the second memories,
wherein each of the first and second memories comprises:
a command decoder that generates a write signal or a dummy write signal when the command designates a write command, generates a read signal or a dummy read signal when the command designates a read command;
an on-die-termination control circuit that activates an on-die-termination control signal in response to the write signal or the dummy write signal and deactivates the on-die-termination control signal in response to the read signal or the dummy read signal; and
an on-die-termination circuit that performs an on-die-termination operation in response to the on-die-termination control signal.

20. The memory system of claim 19, wherein each command decoder of the first memories generates the write signal when the first selection signal is activated and the command designates the write command, generates the read signal when the first selection signal is activated and the command designates the read command, generates the dummy write signal when the first selection signal is deactivated and the command designates the write command, and generates the dummy read signal when the first selection signal is deactivated and the command designates the read command.

21. The memory system of claim 19, wherein each command decoder of the second memories generates the write signal when the second selection signal is activated and the command designates the write command, generates the read signal when the second selection signal is activated and the command designates the read command, generates the dummy write signal when the second selection signal is deactivated and the command designates the write command, and generates the dummy read signal when the second selection signal is deactivated and the command designates the read command.

22. The memory system of claim 19, wherein the on-die-termination control circuit comprises
an on-die-termination enable signal generating circuit that generates the on-die-termination enable signal in response to the write signal or the dummy write signal;
an on-die-termination disable signal generating circuit that generates the on-die-termination disable signal in response to the read signal or the dummy read signal; and
an on-die-termination control signal generating circuit that activates the on-die-termination control signal when the on-die-termination enable signal is activated, and that deactivates the on-die-termination control signal when the on-die-termination enable signal is deactivated or when the on-die-termination disable signal is activated.

23. The memory system of claim 19, wherein the on-die-termination circuit comprises:
a pull up transistor that is turned on, when the on-die-termination control signal is activated, to transmit a power supply voltage;
a pull up resistor connected between the pull up transistor and a termination node;
a pull down transistor that is turned on, when the on-die-termination control signal is activated, to transmit a ground voltage; and
a pull down resistor connected between the pull down transistor and the termination node.

24. A memory comprising:
a command decoder that generates a write signal when a selection signal is activated and a write command is input, that generates a read signal when the selection signal is activated and a read command is input, that generates a dummy write signal when the selection signal is deactivated and the write command is input, and that generates a dummy read signal when the selection signal is deactivated and the read command is input;

an on-die-termination control circuit that activates an on-die-termination control signal in response to the write signal or the dummy write signal and that deactivates the on-die-termination control signal in response to the read signal or the dummy read signal; and an on-die-termination circuit that performs an on-die-termination operation in response to the on-die-termination control signal.

25. The memory of claim 24, wherein the on-die-termination control circuit comprises an on-die-termination enable signal generating circuit that generates an on-die-termination enable signal in response to the write signal or the dummy write signal;

an on-die-termination disable signal generating circuit that generates an on-die-termination disable signal in response to the read signal or the dummy read signal; and an on-die-termination control signal generating circuit that activates the on-die-termination control signal when the on-die-termination enable signal is activated, and that deactivates the on-die-termination control signal when the on-die-termination enable signal is deactivated or when the on-die-termination disable signal is activated.

26. The memory of claim 24, wherein the on-die-termination circuit comprises:

a pull up transistor that is turned on, when the on-die-termination control signal is activated, to transmit a power supply voltage;

a pull up resistor connected between the pull up transistor and a termination node;

a pull down transistor that is turned on, when the on-die-termination control signal is activated, to transmit a ground voltage;

a pull down resistor connected between the pull down transistor and the termination node.

* * * * *